(12) United States Patent
Osako et al.

(10) Patent No.: US 8,300,386 B2
(45) Date of Patent: Oct. 30, 2012

(54) POROUS VALVE METAL THIN FILM, METHOD FOR PRODUCTION THEREOF AND THIN FILM CAPACITOR

(75) Inventors: Toshiyuki Osako, Chiba (JP); Tetsufumi Komukai, Chiba (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 874 days.

(21) Appl. No.: 12/158,783

(22) PCT Filed: Dec. 28, 2005

(86) PCT No.: PCT/JP2005/024121
§ 371 (c)(1),
(2), (4) Date: Jan. 8, 2009

(87) PCT Pub. No.: WO2007/077612
PCT Pub. Date: Jul. 12, 2007

(65) Prior Publication Data
US 2009/0290290 A1     Nov. 26, 2009

(51) Int. Cl.
*H01G 9/04*     (2006.01)
*H01G 9/145*    (2006.01)

(52) U.S. Cl. ........................ 361/528; 361/523
(58) Field of Classification Search .................. 361/523, 361/528–529
See application file for complete search history.

(56) References Cited

U.S. PATENT DOCUMENTS

| | | | |
|---|---|---|---|
| 3,203,793 A | 8/1965 | Hand | |
| 3,889,357 A | 6/1975 | Millard et al. | |
| 6,625,009 B2 * | 9/2003 | Maeda | 361/528 |
| 2008/0106852 A1 * | 5/2008 | Amita et al. | 361/528 |

FOREIGN PATENT DOCUMENTS

| | | |
|---|---|---|
| CN | 1389883 | 12/2002 |
| JP | 60059066 | 4/1985 |
| JP | 1278010 | 11/1989 |
| JP | 547609 | 2/1993 |
| JP | 5047609 | 2/1993 |
| JP | 2003089801 | 3/2003 |
| JP | 2004128242 | 4/2004 |
| JP | 2005072462 | 3/2005 |
| JP | 2006049816 | 2/2006 |
| WO | 2004097870 | 11/2004 |

OTHER PUBLICATIONS

Thaddeus L. Kolski; "Electrolytic Capacitor Anodes Derived from Tantalum-Titanium and Niobium-Titanium Alloys"; Journal of the Electrochemical Society, Electrochemical Society, Manchester, NH, vol. 112, No. 3, Jan. 1, 1965; ISSN: 0013-4651.

* cited by examiner

*Primary Examiner* — Eric Thomas
(74) *Attorney, Agent, or Firm* — Hartman Global IP Law; Gary M. Hartman; Domenica N. S. Hartman

(57) ABSTRACT

A porous valve metal thin film, a method for the production thereof, and a thin film capacitor utilizing the thin film as an anode. The porous valve metal thin film has an integral continuous structure that includes the valve metal, an outside surface, and micropores connected to the outside surface. The thin film has a surface area that is at least double a surface area of the outside surface if the outside surface of the thin film were flat. The valve metal is niobium, tantalum, a niobium alloy or a tantalum alloy and has a particle diameter within a range of 10 nm to 1 µm. The micropores have pore diameters within a range of 10 nm to 1 µm.

15 Claims, No Drawings

POROUS VALVE METAL THIN FILM, METHOD FOR PRODUCTION THEREOF AND THIN FILM CAPACITOR

CROSS REFERENCE TO RELATED APPLICATIONS

This application claims the benefit of International Application No. PCT/JP2005/024121 filed Dec. 28, 2005.

BACKGROUND OF THE INVENTION

The present invention relates to a porous valve metal thin film, a method for production thereof, and a thin film capacitor using the same, and particularly, one using tantalum oxide or niobium oxide.

BACKGROUND ART

The thin film capacitor is an important component in packaged devices such as high-frequency hybrid electronic devices and multi-chip modules, and importance thereof is increasing as the electronic devices decreases in thickness. Recently, as the devices are further integrated and densified, an area of the thin film capacitor needs to be decreased, and thus, a thin film capacitor having a large capacitance density (capacity per unit area) has been desired.

Here the thin film capacitor has a basic configuration such that a lower electrode layer, a dielectric layer, and an upper electrode layer are sequentially laminated and formed on a base material.

As a dielectric for the thin film capacitor, tantalum oxide obtained by subjecting tantalum, which is one kind of valve metal, to anodic oxidation has been widely used heretofore. This is because tantalum oxide has an excellent dielectric characteristic. Here, the valve metal stands for a metal, the surface of which is covered with an oxide film of the metal due to anodic oxidation.

As a method of forming the thin film capacitor utilizing tantalum oxide, there are a method of forming tantalum oxide directly on a lower electrode present on the surface of a substrate by a vacuum process such as sputtering or CVD, and a method of forming tantalum oxide by subjecting the surface of Ta formed on the substrate to anodic oxidation, and the like. However, according to these methods, there is a limitation on the capacitance density due to a flat structure formed on a smooth substrate.

The capacitance of the capacitor is generally expressed as the following numerical expression 1, and is determined by the dielectric constant, the surface area, and the thickness of the dielectric.

$$C = \varepsilon \varepsilon_0 \frac{S}{d} = \varepsilon \varepsilon_0 \frac{S}{aV} \quad \text{[Numerical expression 1]}$$

Here, $\varepsilon_0$ denotes dielectric constant in a vacuum (8.854×$10^{-12}$ (F/m)), $\varepsilon$ denotes relative dielectric constant, S denotes electrode surface area (m$^2$), d denotes thickness of the dielectric (m), a denotes formation constant (m/V), and V denotes anodic oxidation voltage (V).

When an oxide film (dielectric) is formed by anodic oxidation, the thickness of the oxide film (dielectric) is proportional to the voltage to be applied (a proportional constant at this time is referred to as a formation constant). Therefore, the thickness of the oxide film (dielectric) can be expressed by the product of the formation constant and the anodic oxidation voltage.

Moreover in an electrolytic capacitor in which the dielectric is formed by anodic oxidation, a product CV (FV) of the capacity C and the anodic oxidation voltage V is frequently used as a capacitance index. The capacitance index CV is expressed as the following numerical expression 2, which is obtained by transforming numerical expression 1. Therefore, theoretical capacitance density when it is assumed that the thin film capacitor has a flat structure can be obtained by using the following numerical expression 3, which is obtained by transforming numerical expression 2, assuming that the electrode surface area of the thin film capacitor is $S_0$.

$$CV = \varepsilon \varepsilon_0 \frac{S}{a} \quad \text{[Numerical expression 2]}$$

$$\frac{CV}{S_0} = \frac{\varepsilon \varepsilon_0}{a} \quad \text{[Numerical expression 3]}$$

The theoretical capacitance density of flat thin film capacitor, in which $Ta_2O_5$, $Nb_2O_5$ or $Al_2O_3$ is used as the dielectric, is obtained based on numerical expression 3. The results are as shown in Table 1 below.

TABLE 1

|  | $Ta_2O_5$ | $Nb_2O_5$ | $Al_2O_3$ |
|---|---|---|---|
| Dielectric constant $\varepsilon$ | 27 | 41 | 7-10 |
| Formation constant (m/V) | 1.7 | 2.5 | 1.3-1.7 |
| Theoretical capacitance density ($\mu$FV/cm$^2$) | 14 | 15 | 4-7 |

On the other hand, as is apparent from numerical expression 2, since CV is proportional to the surface area S, a method for increasing the capacitance density by preparing an anode having a great surface area has been conventionally used. For example, there is an aluminum electrolytic capacitor utilizing an aluminum foil, which is roughened by etching and the like, or a tantalum electrolytic capacitor or niobium electrolytic capacitor utilizing a porous pellet of tantalum or niobium.

However, since tantalum and niobium are metals excellent in corrosion resistance, it is difficult to perform roughening by etching. Furthermore when the porous pellet is used, generally, fine powders thereof are powder-pressed and sintered to produce the anode. With powder compacting and firing however, there is a limitation in thinning of the pellet. Moreover, at the time of production of the porous pellet, a sponge-like granulated powder having primary particles of about several hundred nanometers to several micrometers is generally used. Furthermore in order to obtain continuous porous pellets by sintering the granulated powders, sintering is performed at a temperature as high as 1000° C. or higher. However, since sintering is performed at a high temperature of 1000° C. or higher, the primary particles in the granulated powder are coarsened, thereby decreasing the surface area, and simultaneously, the micropore diameter also decreases, thereby making it difficult to impregnate the electrolyte into the porous body. Accordingly, with the tantalum electrolytic capacitor or the niobium electrolytic capacitor using porous pellets of tantalum or niobium, it is difficult to obtain a thin anode having a great micropore diameter and a great surface area.

On the other hand, as a method for obtaining a thin tantalum or niobium anode having a great surface area, a method where a tantalum-titanium alloy or niobium-titanium alloy is heated in a vacuum, and titanium is evaporated and removed to obtain a porous foil has been proposed in Thaddeus L. Kolski, "Electrolytic Capacitor Anodes Derived from Tantalum-Titanium and Niobium-Titanium Alloys," JOURNAL OF THE ELECTROCHEMICAL SOCIETY, March 1965, Vol. 112, No. 3, p. 272-p. 279. According to this method however, a temperature as high as 2000° C. or higher is required for evaporating titanium, and control of the micropore diameter is difficult, which makes the method unpractical.

Furthermore a method in which tantalum or niobium powder is shaped in a paste form, and applied to an electrode substrate and fired has been also proposed in U.S. Pat. No. 3,889,357. According to this method however, cracks easily occur in the anode due to sintering shrinkage. Moreover, with this method, the micropore diameter becomes small as with the method of using porous pellets, and there is a problem in the impregnating ability of the electrolyte.

BRIEF SUMMARY OF THE INVENTION

In view of the above situation, it is an object of the present invention to provide a porous valve metal thin film having a great surface area, a method for production thereof, and a thin film capacitor having a large capacitance density in which the porous valve metal thin film is utilized as the anode.

The porous valve metal thin film according to the present invention is a porous thin film made of a valve metal and having a number of micropores connected to the outside, wherein a surface area of the thin film is more than or equal to double a surface area when it is assumed that a surface of the thin film is flat.

The size of a pore diameter in the porous thin film is preferably within a range of from 10 nm to 1 μm.

Moreover a particle diameter of the valve metal is preferably within a range of from 10 nm to 1 μm.

Furthermore, the valve metal is preferably niobium, tantalum, a niobium alloy, or a tantalum alloy.

A first aspect of a method for production of a porous valve metal thin film according to present invention comprises; forming a thin film made of a valve metal and a hetero-phase component in which a particle diameter of the valve metal and a particle diameter of the hetero-phase component are both within a range of from 1 nm to 1 μm; subjecting the thin film to a heat treatment at a temperature below a melting point of the hetero-phase component to sinter the thin film; and removing the hetero-phase component from the heat-treated thin film substantially selectively, to thereby form a porous thin film made of a valve metal. Here, the term "removing the hetero-phase component from the heat-treated thin film substantially selectively" stands for removing the hetero-phase component in the thin film to a degree that does not adversely affect the effect of the present invention or more.

A second aspect of a method for production of a porous valve metal thin film according to present invention comprises; forming a thin film made of a valve metal and a hetero-phase component in which a particle diameter of the valve metal and a particle diameter of the hetero-phase component are both within a range of from 1 nm to 1 μm, and at the same time; subjecting the thin film to a heat treatment at a temperature below a melting point of the hetero-phase component to sinter the thin film; and removing the hetero-phase component from the heat-treated thin film substantially selectively, to thereby form a porous thin film made of a valve metal.

A third aspect of a method for production of a porous valve metal thin film according to present invention comprises; forming a thin film made of a valve metal and a hetero-phase component in which a particle diameter of the valve metal and a particle diameter of the hetero-phase component are both within a range of from 1 nm to 1 μm, subjecting the thin film to a heat treatment at a temperature of from 200° C. to 1400° C. inclusive, and then removing the hetero-phase component, wherein the hetero-phase component is an oxide which is thermodynamically stable with respect to the valve metal, and which can be substantially selectively removed from the valve metal.

The oxide forming the hetero-phase component is preferably MgO and/or CaO.

A fourth aspect of a method for production of a porous valve metal thin film according to present invention comprises; forming a thin film made of a valve metal and a hetero-phase component in which a particle diameter of the valve metal and a particle diameter of the hetero-phase component are both within a range of from 1 nm to 1 μm, subjecting the thin film to a heat treatment in a vacuum at a temperature of from 200° C. to 1030° C. inclusive, and then removing the hetero-phase component, wherein the hetero-phase component is a metal that does not substantially dissolve in the valve metal and can be substantially selectively removed from the valve metal. Here, the term "does not substantially dissolve" means that the hetero-phase component is allowed to dissolve in the valve metal to a degree that does not adversely affect the effect of the present invention.

A fifth aspect of a method for production of a porous valve metal thin film according to present invention comprises; forming a thin film made of a valve metal and a hetero-phase component in which a particle diameter of the valve metal and a particle diameter of the hetero-phase component are both within a range of from 1 nm to 1 μm, subjecting the thin film to a heat treatment in an argon atmosphere at a temperature of from 200° C. to 1060° C. inclusive, and then removing the hetero-phase component, wherein the hetero-phase component is a metal that does not substantially dissolve in the valve metal and can be substantially selectively removed from the valve metal.

The metal forming the hetero-phase component is preferably Cu and/or Ag.

A sixth aspect of a method for production of a porous valve metal thin film according to present invention comprises; forming a thin film made of a valve metal and a hetero-phase component in which a particle diameter of the valve metal and a particle diameter of the hetero-phase component are both within a range of from 1 nm to 1 μm, subjecting the thin film to a heat treatment in a vacuum at a temperature of from 200° C. to 600° C. inclusive, and then removing the hetero-phase component, wherein the hetero-phase component is Mg and/or Ca.

A seventh aspect of a method for production of a porous valve metal thin film according to present invention comprises; forming a thin film made of a valve metal and a hetero-phase component in which a particle diameter of the valve metal and a particle diameter of the hetero-phase component are both within a range of from 1 nm to 1 μm, subjecting the thin film to a heat treatment in an argon atmosphere at a temperature of from 200° C. to 630° C. inclusive, and then removing the hetero-phase component, wherein the hetero-phase component is Mg and/or Ca.

An eighth aspect of a method for production of a porous valve metal thin film according to present invention comprises; forming a thin film made of a valve metal and a hetero-phase component, in which a particle diameter of the valve metal and a particle diameter of the hetero-phase component are both within a range of from 1 nm to 1 μm, on a substrate heated to 100° C. to 400° C., and then removing the hetero-phase component. The hetero-phase component is preferably Mg and/or Ca, or Cu and/or Ag.

An amount to be added of the hetero-phase component is preferably from 30 to 70% by volume.

The thin film may be formed on a valve metal smooth film or on one side or both sides of a metal foil. Moreover the thin film can be formed by using a sputtering method or a vacuum deposition method.

The valve metal is preferably niobium, tantalum, a niobium alloy, or a tantalum alloy.

A first aspect of a capacitor anode material according to the present invention comprises a metal foil, and a porous valve metal thin film according to the present invention, and the porous valve metal thin film is formed on one side or opposite sides of the metal foil.

The metal foil preferably comprises niobium, tantalum, a niobium alloy, or a tantalum alloy, which are valve metals. Moreover, a metal foil comprising Cu can be used.

A second aspect of a capacitor anode material according to the present invention comprises; an insulating substrate, a valve metal smooth film formed on the insulating substrate, and a porous valve metal thin film according to the present invention formed on the valve metal smooth film.

The insulating substrate is preferably made of any one of alumina, quartz, and surface thermally-oxidized silicon. Moreover, the insulating substrate is preferably made of any one of a polyimide resin substrate, a polysulphone resin substrate, a polyetherimide resin substrate, and a polyether ketone resin substrate.

A first aspect of a capacitor thin film anode according to the present invention comprises a porous valve metal thin film according to the present invention, and an oxide film of the valve metal formed on a surface of the porous valve metal thin film.

A second aspect of a capacitor thin film anode according to the present invention comprises a porous valve metal thin film made of a capacitor anode material in the first or the second aspect of the present invention, and an oxide film of the valve metal formed on a surface of the porous valve metal thin film.

A first aspect of a thin film capacitor according to the present invention comprises a capacitor thin film anode according to the first and the second aspects of the present invention as a capacitor anode.

A second aspect of a thin film capacitor according to the present invention comprises; a capacitor thin film anode according to the first and the second aspects of the present invention, an electrically conductive layer formed on a surface oxide film of the capacitor thin film anode, and a cathode formed on the electrically conductive layer. A solid electrolyte can be used for the electrically conductive layer. The solid electrolyte is, for example, manganese dioxide or an electroconductive polymer.

Because the valve metal thin film according to the present invention is porous with micropores uniformly distributed, not only a great surface area can be obtained, but also the electrolyte can penetrate therein sufficiently. Therefore, the thin film capacitor using the valve metal thin film according to the present invention as the anode has greater capacitance density as compared to the conventional capacitor.

DETAILED DESCRIPTION OF THE INVENTION

The present inventor has considered that three-dimensional perspective is required to rapidly increase the surface area of the anode in the thin film capacitor. This is because if the surface area is considered three-dimensionally, there is theoretically no upper limit to increasing the surface area.

To materialize this concept, the present inventor has performed intensive study, and as a result, has found that when the valve metal thin film, whose surface is covered with an oxide film due to anodic oxidation, is made porous, to provide a plurality of micropores connected to the outside, the surface area of the anode of the thin film capacitor can be rapidly increased, and has thus reached the present invention. The reason why the plurality of micropores provided in the valve metal needs to be connected to the outside is that if the micropores are not connected to the outside, the electrolyte does not penetrate into the provided micropores, and the valve metal thin film does not function as the anode of the thin film capacitor.

According to such a structure, the surface area of the thin film can be more than or equal to double the surface area when it is assumed that the surface of the thin film is flat.

Moreover in the porous valve metal thin film according to the present invention, the micropores are uniformly distributed due to production according to a method described later. Therefore, by increasing the thickness of the thin film, the surface area thereof can be easily increased in proportion to the thickness. On the other hand, as described above, the capacitance of the capacitor increases in proportion to the surface area of the electrode (see numerical expressions 1 and 2). Accordingly, in the porous valve metal thin film obtained by the present invention, the capacitance density can be easily increased by increasing the thickness of the thin film, and hence, it is ideal as an anode for producing a thin film capacitor having a large capacitance density.

Next is a description of a method for production of a porous valve metal thin film according to the present invention.

The production method of the porous valve metal thin film according to the present invention comprises: 1) a step of preparing a thin film in which a valve metal and a hetero-phase component have a particle diameter within a range of from 1 nm to 1 μm, and the valve metal and the hetero-phase component are uniformly distributed; 2) a step of subjecting the thin film to a heat treatment so as to adjust the particle diameter and to sinter the film appropriately; and 3) a step of removing the hetero-phase portion.

Hereunder is a detailed description of each step.

1) Step of Preparing a Thin Film in which a Valve Metal and a Hetero-Phase Component have a Particle Diameter within a Range of from 1 nm to 1 μm, and the Valve Metal and the Hetero-Phase Component are Uniformly Distributed At first, a thin film is prepared in which the valve metal and the hetero-phase component have a particle diameter within a range of from 1 nm to 1 μm, and the valve metal and the hetero-phase component are uniformly distributed. At this time, if the particle diameter of the valve metal and the hetero-phase component is not within the range of from 1 nm to 1 μm, or distribution of the valve metal and the hetero-phase component is not uniform, nonuniform grain growth occurs in a subsequent heat treatment process, and a primary particle diameter and micropore distribution of the porous valve metal thin film finally obtained becomes nonuniform. The particle diameter range and distribution uniformity of the valve metal and the hetero-phase component can be easily confirmed by a scanning electron microscope, if the particle diameter is about several hundred nanometers. When the particle diameter is as fine as 1 nm, the particle diameter range and distribution uniformity can be confirmed by a transmission electron microscope. The distribution of the valve metal and the hetero-phase component can be confirmed by an image such as a Z contrast image of the transmission electron microscope.

As a method for obtaining the thin film in which the valve metal and the hetero-phase component have a particle diameter within the range of from 1 nm to 1 μm, and the valve metal and the hetero-phase component are uniformly distributed, a printing method can be considered, in which the particles of the valve metal and the hetero-phase component having the particle diameter within the range of from 1 nm to 1 μm are distributed in a volatile binder, and the binder component is evaporated after application to give fixing. Moreover, various methods such as a CVD (chemical vapor deposition) method, a sputtering method, and a vacuum deposition method can be considered.

Thus, various methods can be considered. However, it is preferable to use the sputtering method or the vacuum deposition method. In the thin film forming process using these methods, flying substances at an atomic or cluster level adhere on the substrate to form the thin film. Therefore, the thin film formed of a continuum in which the distribution of the valve metal and the hetero-phase component is uniform can be obtained easily with excellent reproducibility.

As a substrate used in film formation by the sputtering or vacuum deposition method, various metal foil substrates or insulating substrates can be basically used. When the metal foil is used as the substrate, the thin film in which the valve metal and the hetero-phase component are uniformly distributed can be formed not only on one side but also on opposite sides of the metal foil. However, there may be a limitation on the heat treatment temperature in the subsequent process due to heat resistance or the like of the substrate.

When characteristics, handling properties, and application to various applications of the thin film capacitor are taken into consideration, it is preferable to use an Nb foil, Ta foil, Nb alloy foil, Ta alloy foil, or Cu foil as the metal foil substrate. When the thin film capacitor is produced, the upper electrode and the lower electrode need to be insulated. However, if the Nb foil, Ta foil, Nb alloy foil, or Ta alloy foil, which is the valve metal, is used as the substrate, an insulating film having high reliability can be formed not only on the porous body but also on the valve metal foil substrate at the time of anodic oxidation, which is preferable in view of producing the thin film capacitor with a relatively easy process. On the other hand, when the Cu foil is used as the substrate, an insulating layer made of a resin or an oxide needs to be provided between the upper electrode and the lower electrode. Although the process becomes slightly complicated as compared to the case using the valve metal foil, the Cu foil is an inexpensive material widely used heretofore for printed circuit boards, and it is preferable in view of the cost and application to the printed circuit board process.

As the insulating substrate, a substrate made of alumina, quartz or thermally-oxidized silicon is preferably used. Also, a substrate made of polyimide, polysulphone, polyetherimide or polyether ketone is preferably used.

The thin film in which the valve metal and the hetero-phase component are uniformly distributed may be directly formed on the metal foil substrate, or after a dense valve metal smooth film is first formed on the insulating substrate, the thin film may be formed thereon. The metal foil or the dense valve metal smooth film becomes the lower electrode when the thin film capacitor is finally formed.

A composition ratio of the valve metal and the hetero-phase component is determined, taking into consideration porosity of the porous thin film finally obtained. In the range of the present invention, there is a tendency in that as the hetero-phase component increases, a porous thin film having a higher porosity is obtained. This is because a component capable of being removed selectively from the valve metal is used for the hetero-phase component, and the hetero-phase component does not remain in the porous valve metal thin film finally obtained. Specifically, it is desired to select the hetero-phase component from metal components that do not dissolve substantially in the valve metal, or from oxides thermodynamically stable with respect to the valve metal, in view of easiness of removal. For example, when the valve metal is tantalum or niobium, a metal such as Cu or Ag is preferably used, other than alkaline-earth metals such as Mg and Ca, as the hetero-phase component of the metal. These metals hardly dissolve in tantalum and niobium. Particularly, Mg may be used as a reducing agent at the time of producing tantalum powder and niobium powder for electrolytic capacitors according to an oxide reduction method, and it is known that Mg remains in the powder only in an order of ppm. Moreover, MgO and CaO are preferably used for the hetero-phase component of the oxide.

An amount to be added of the hetero-phase component needs to be adjusted according to the object, since the microstructure thereof is different according to the film forming method, however it is generally desired to add the hetero-phase component in an amount of from 30 to 70% by volume. This is because there may be a case in which the film does not have any special orientation depending on the film forming method, and in such a case, if the amount of the hetero-phase component to be added is 30% or less, the hetero-phase component does not form a continuous layer, and there may be parts where open pores adjacent to the outside are not formed. On the other hand, when the hetero-phase component is added in an amount exceeding 70%, the valve metal does not form a continuous layer, and when the hetero-phase component is removed, the valve metal may be peeled off from the film. However, this amount is only an indication, and does not restrict the amount to be added of the hetero-phase component. An amount to be added outside this range may be adopted according to a degree of orientation of the film, which is different according to the film forming method, and the use of the obtained thin film.

2) Step of Subjecting the Thin Film to a Heat Treatment so as to Adjust the Particle Diameter and to Appropriately Sinter the Film The thin film obtained according to the above described step is subjected to a heat treatment in an inert atmosphere or in a vacuum, to encourage sintering between the valve metal particles, and to encourage crystal grain growth of the hetero-phase component. The reason why it is necessary to encourage sintering between the valve metal particles is to ensure integrity of the structure comprising the valve metal, and the reason why it is necessary to encourage the crystal grain growth of the hetero-phase component is that the electrolyte cannot be filled unless the pores after removal of the hetero-phase component have a certain size.

The heat treatment atmosphere and temperature are determined, taking into consideration the distribution and compositions of the valve metal and the hetero-phase component, and the melting point and vapor pressure of the hetero-phase component, regarding the thin film obtained in the above mentioned step. The heat treatment is basically performed at a temperature below the melting point of the hetero-phase component. If the heat treatment temperature exceeds the melting point, the hetero-phase component dissolves during the heat treatment, thus does not play a role of inhibiting sintering of the value metal particles and maintaining the pores. Moreover, when the heat treatment is carried out at a temperature close to the melting point of the hetero-phase component, or when a metal having a high vapor pressure such as Mg is used as the hetero-phase component, if the heat treatment is carried out in a vacuum, the hetero-phase component is volatilized. Therefore, as described above, the hetero-phase component inhibits sintering of the value metal particles and does not play the role of maintaining the pores. In such a case, volatilization of the hetero-phase component can be suppressed by performing the heat treatment in an inert atmosphere such as an Ar atmosphere.

Generally, as the heat treatment temperature becomes low, the structure becomes fine, and a porous valve metal thin film having a great surface area can be obtained. However, at a temperature of 200° C. or less, sintering does not proceed, coupling between particles is weak, and the structure including the valve metal may not be able to maintain the integrity after the hetero-phase component is removed. Therefore, it is preferable to perform the heat treatment at a temperature equal to or higher than 200° C. When the heat treatment is performed in a low temperature range of from 200 to 600° C., it is preferable to use Mg (melting point 650° C.) or the like, which is an alkaline-earth metal having a low melting point, as the hetero-phase component, from the standpoint of grain growth of the hetero-phase component.

When the sputtering or vacuum deposition method is used, the particle diameter can be adjusted at the same time as performing formation of the thin film including the valve metal and the hetero-phase component, by forming the thin film while heating the substrate. According to this method, since heating is performed in a process in which the film is deposited on the substrate, the grain growth of the valve metal and the hetero-phase component can be encouraged at a temperature (100 to 400° C.) lower than that in the case of heating after film formation. Therefore, it is an effective method particularly when a resin substrate having low heat resistance is used.

In the conventional production method of the tantalum or niobium electrolytic capacitor, as described above, the sponge-like granulated powder having primary particles of about several hundred nanometers to several micrometers is generally powder-pressed and sintered, and sintering between the granulated powders is performed to produce the anode as a porous pellet. In these methods, sintering is performed generally at a temperature as high as 1000° C. or higher, depending on the particle diameter of the powder. However, the primary particles in the granulated powder are fine, and there is nothing physically inhibiting sintering. Therefore the growth of the primary particles rapidly advances in the heat treatment at a temperature as high as 1000° C. or higher, thereby decreasing the surface area, which is not desirable. Moreover, the decrease in the surface area due to sintering is too rapid to be controlled.

Furthermore in the conventional production method of the tantalum or niobium electrolytic capacitor, the pores become small simultaneously with the advancement of the sintering. Therefore, there is a portion where impregnation of the electrolyte becomes difficult, and the portion of the porous body that can contribute to the capacity of the capacitor decreases, thereby decreasing the capacity appearance ratio.

On the other hand, according to the method of the present invention, an integral continuous structure comprising the valve metal has been already formed at the stage when the film including the valve metal and the hetero-phase component is initially formed. Therefore, the heat treatment for obtaining the continuous structure can be sufficiently performed at a low temperature of 200° C. or higher and below 1060° C. Since the heat treatment temperature is low, the particles after sintering can be maintained in a size of 0.2 μm or less. Moreover, heat treatment can be performed at a temperature of from 1060° C. to 1400° C. inclusive by using an oxide such as MgO or CaO as the hetero-phase component for further increasing the pore diameter. Even if the heat treatment is performed at such a high temperature, since the presence of the hetero-phase component physically inhibits the grain growth of the valve metal particles, a fine structure of 1 μm or less can be obtained, and sintering can be controlled easily.

It is preferable that the particle diameters of the valve metal and the hetero-phase component after heat treatment fall within a range of from 10 nm to 1 μm.

This is because if the particle diameter of the valve metal is smaller than 10 nm, connection between the valve metal particles is weak, and the integrity as the valve metal structure is insufficient. Furthermore if the particle diameter of the valve metal is larger than 1 μm, the surface area of the porous valve metal thin film after removal of the hetero-phase component is not sufficiently large.

If the particle diameter of the hetero-phase component is smaller than 10 nm, the pores after removal of the hetero-phase component become too small, and the electrolyte can hardly penetrate therein. Moreover if the particle diameter of the hetero-phase component is larger than 1 μm, the surface area of the porous valve metal thin film after removal of the hetero-phase component is not sufficiently large.

The effect of the method of the present invention is particularly large with respect to primary particles as fine as 0.2 μm in which the growth tends to proceed rapidly, in that an adverse effect due to the progress of sintering is suppressed. Moreover, with respect to primary particles with a particle diameter of larger than 0.2 μm, the effect of suppressing the adverse effect due to the progress of sintering can be naturally demonstrated, and hence the method of the present invention can demonstrate the effect sufficiently until the particle diameter of the primary particles exceed 1 μm.

As a conventional method, a method of applying the powder to an electrode substrate in a paste form and sintering the substrate has been tried. However, in this case, cracks easily occur in the anode due to sintering shrinkage.

On the other hand, according to the method of the present invention, when the film including the valve metal and the hetero-phase component is initially formed, the integral continuous structure comprising the valve metal has been already formed, and the hetero-phase component is also present. Therefore sintering shrinkage can be suppressed even at the time of heat treatment. Accordingly, even after the heat treatment, there is little sign of a decrease in porosity, and cracks hardly occur.

3) Step of Removing the Hetero-Phase Portion

After the particle diameter is adjusted by the heat treatment, the hetero-phase component is removed. Various methods can be used as the removing method, but due to easiness of operation, it is preferable to dissolve and remove the hetero-phase component by acid, utilizing the excellent corrosion resistance of tantalum and niobium. As the type of acid to be used, one which selectively dissolves only the hetero-phase component is selected. For example, when Cu or Ag is used as the hetero-phase component, nitric acid or hydrogen peroxide can be used. When Mg, Ca, MgO, or CaO is used as the hetero-phase component, hydrochloric acid or the like can be used. After the hetero-phase component is dissolved and removed by the solution thereof, washing and drying are performed, thereby enabling the porous valve metal thin film to be obtained.

In the porous valve metal thin film thus obtained, the pores are uniformly distributed and the surface area of the film is great.

Here in order to express the effect of the method according to the present invention quantitatively, measurement of the surface area of the porous thin film needs to be performed, however, strict measurement is difficult.

Therefore, the present inventor has focused attention on the fact that the surface area of the electrode in the capacitor is proportional to capacitance thereof (see numerical expression 1), and estimated the surface area of the electrode in the capacitor, that is, the surface area of the porous valve metal thin film, from the capacitance after anodic oxidation, to perform evaluation.

Specifically, it can be determined whether the surface area of the obtained porous valve metal thin film is at least twice the area of a thin-film forming part (the surface area of the thin film when it is assumed that the surface of the thin film is smooth), by comparing the capacitance between a dense smooth film subjected to anodic oxidation under the same condition and the obtained porous valve metal thin film. Whether the porous valve metal thin film has a surface area twice the area of the thin-film forming part (the surface area of the thin film when it is assumed that the surface of the thin film is smooth) becomes a criterion for determining that a sufficient effect of the present invention is demonstrated.

Furthermore by using such an evaluation method, it can be quantitatively ascertained that the surface area increases as the thickness of the thin film is increased.

However the surface area is not uniquely determined by only one parameter, and depends on the film thickness, the composition ratio of the valve metal and the hetero-phase component, and the heat treatment temperature. Regarding the film thickness, as the film thickness increases, the porous structure is accumulated three-dimensionally to increase the surface area. Regarding the composition ratio, when the contained ratio of the hetero-phase component is about 30 to 70% by volume, as the composition ratio of the hetero-phase component increases, the film becomes porous to increase the surface area. Regarding the heat treatment temperature, as the temperature becomes low, the grain growth at the time of heat treatment hardly occurs and the surface area increases. However, if the temperature is too low, the structure of the valve metal does not have integrity and does not form a continuous body. Therefore, it is desired that the heat treatment temperature be 200° C. or higher.

The porous valve metal thin film prepared so as to satisfy the conditions of the present invention can be preferably used as a thin film anode for capacitors. The porous valve metal thin film according to the present invention can be formed on a valve metal film formed on an insulating substrate, or on a valve metal foil.

The porous valve metal thin film according to the present invention can be produced depending on the selection of the hetero-phase component, without depending on the type of the valve metal such as Ta, Nb, and Al. However, one including Nb, Ta, Nb alloy, or Ta alloy as the valve metal has high practicality, when a dielectric characteristic of the oxide thereof is taken into consideration. As the hetero-phase component, various kinds of metal elements and oxides can be selected. However, when solubility and stability thereof with respect to Nb, Ta, Nb alloy, or Ta alloy, and the degree of difficulty of removal thereof are taken into consideration, it is preferable to use an alkaline-earth metal such as Mg or Ca, a metal such as Cu or Ag, or an oxide such as MgO or CaO as the hetero-phase component.

EXAMPLES

Hereunder is a detailed description of the present invention, with reference to examples. In examples 1 to 7 and comparative examples 1 to 4, the capacitance after a liquid electrolyte is filled in an anode is measured, and in example 8, the capacitance after a solid electrolyte (manganese dioxide) is filled in the anode is measured.

The hetero-phase component in the present invention forms micropores after removal thereof, thereby playing a role of making the valve metal film porous. Therefore, if the hetero-phase component is selected, taking into consideration the solubility and stability thereof with respect to the valve metal and the degree of difficulty of removal thereof, a porous thin film having a great surface area can be obtained from any valve metal. Consequently hereunder is a detailed description of Nb and Ta having high practicality as the thin film capacitor, and examples of other valve metals are omitted.

Example 1

Hydrogenated and pulverized Nb (manufactured by Tokyo Denkai Co. Ltd., purity 99.9%, grain size 60 to 200 mesh), and MgO (manufactured by Kanto Chemical Co., Inc., purity 99.99%) were weighed so that these were 50% by volume, then mixed by using a rocking mixer (manufactured by Aichi Electric Co., Ltd.) at 100 rpm for one hour, after which hot pressing was performed for one hour at a pressure of 24.5 MPa and a temperature of 1400° C., to prepare a target having a diameter of 60 mm.

An Nb foil in a size of 10 mm×10 mm with a thickness of 0.1 mm (manufactured by Tokyo Denkai Co. Ltd., purity 99.9%) was set as a substrate in a sputtering system (SPF-210H, manufactured by Canon Anelba Corporation). The prepared target was subjected to RF sputtering at a sputtering power of 200 W in an argon atmosphere of 10 mTorr, to thereby form a film having a thickness of 850 nm. The film was subjected to heat treatment in a vacuum at a temperature of 600° C. for one hour, and soaked in 6.7 mol/L of hydrochloric acid for one hour, so that MgO was removed by elution.

After the obtained sample was washed in water and dried, an Nb wire having a diameter of 0.2 mm was attached to a rear face of the Nb foil as a lead by spot welding. This was subjected to anodic oxidation in a phosphoric acid aqueous solution of 80° C. at a voltage of 10V for 10 hours, to thereby form a dielectric layer. The capacitance of the obtained sample was measured at an applied bias of 1.5V, at a frequency of 120 Hz, and at a root-mean square value of 1.0 Vrms, by using an LCR meter (4263B, manufactured by Agilent Technologies, Inc.) in 40% by mass of sulfuric acid. The results thereof are shown in Table 2. Since the measured capacitance included the capacity of a surface on which a film was not formed (rear face of the Nb foil), the capacitance of this portion (2.87/2=1.435° F. from the results of comparative example 1) was subtracted from the measured capacitance, to obtain the capacitance of the porous film portion. The obtained capacitance value was divided by the area of the film-formed portion (1 cm$^2$), to obtain the capacitance density (capacity per unit area).

Example 2

The same processing as example 1 was performed, except that the heat treatment after film formation was carried out in a vacuum at a temperature of 1200° C. The obtained results are shown in Table 2.

Comparative Example 1

The Nb foil used as the substrate in example 1 was subjected to the same anodic oxidation as in example 1, and the capacitance was measured. The results are shown in Table 2.

TABLE 2

| Anode No. | Hetero-phase component Compt. | Content ratio (vol %) | Film thickness of porous portion (nm) | Heat treatment temperature (° C.) |
|---|---|---|---|---|
| Ex. 1 | 1 | MgO | 50 | 850 | 600 |
| Ex. 2 | 2 | MgO | 50 | 850 | 1200 |
| Com-Ex. 1 | 3 | — | — | — | — |

| | Anodic Oxidation Voltage (V) | Capacitance (μF) | Capacitance Density (μFV/cm²) |
|---|---|---|---|
| Ex. 1 | 10 | 16.65 | 152.1 |
| Ex. 2 | 10 | 10.3 | 88.65 |
| Com-Ex. 1 | 10 | 2.87 | 14.3 |

(Ex. = Example, Com-Ex. = Comparative Example)

It is seen that anode No. 3 in comparative example 1 has approximately the same capacitance density as the theoretical capacitance density of $Nb_2O_5$ shown in Table 1. On the other hand, anode No. 1 in example 1 has a capacitance density about 10.6 times as large as the capacitance density of anode No. 3 in comparative example 1. Therefore, it is considered that anode No. 1 in example 1 has a surface area 10.6 times as large as the surface area of anode No. 3 in comparative example 1 (Nb foil). It is considered that the reason why the surface area is increased is that anode No. 1 in example 1 is a porous thin film. Moreover, anode No. 2 in example 2 has a capacitance density 3.6 times as large as the capacitance density of anode No. 3. That is, although the heat treatment was performed at a temperature as high as 1200° C., anode No. 2 had a surface area 3.6 times as large as that of anode No. 3 in comparative example 1. It is considered that this is because MgO as the hetero-phase component is present stably even at a high temperature, to inhibit sintering of the Nb particles.

Example 3

Ta and Mg targets having a purity of 99.99% (both having a diameter of 152.4 mm, manufactured by Kojundo Chemical Laboratory Co., Ltd.) were used, to form a film on a quartz substrate in an argon atmosphere of 10 mTorr by using a DC sputtering system (SBH-2206, manufactured b, ULVAC, Inc.). Film formation was performed by applying a metal mask on the quartz substrate, so that a 10 mm square film was formed on the substrate, and a pattern having a lead portion with a width of 1 mm was formed above the 10 mm square film.

At first, only Ta was film-formed to a thickness of 400 nm, and thereafter, a film having a Ta—Mg composition in which Ta was 60% by volume was formed to a thickness of 300 nm by cosputtering of Ta and Mg. This film was subjected to heat treatment in the argon atmosphere at a temperature of 400° C. for one hour, and soaked in 6.7 mol/L of hydrochloric acid for one hour, so that Mg was removed by elution.

After the film was washed in water and dried, the film was subjected to anodic oxidation in a phosphoric acid aqueous solution of 80° C. at a voltage of 10V for 10 hours, to thereby form a dielectric layer. The capacitance was calculated by performing measurement of the capacitance in the same manner as in example 1. The results are shown in Table 3.

Example 4

The same film forming operation was performed as in example 3, except that a polyimide film (thickness 75 μm, manufactured by Ube Industries, Ltd.) was used as the substrate, and after the substrate was heated to about 300° C., cosputtering was performed by using a Ta target and an Mg target. In example 3 and examples 5 to 7, sputtering was performed without heating the substrate.

After the film was formed, heat treatment was not performed, and the film in the formed state was soaked in 6.7 mol/L of hydrochloric acid for one hour, so that Mg was removed by elution.

After the film was washed in water and dried, the film was subjected to anodic oxidation in a phosphoric acid aqueous solution of 80° C. at a voltage of 10V for 10 hours, to thereby form a dielectric layer. The capacitance was calculated by performing measurement of the capacitance in the same manner as in example 1. The results are shown in Table 3.

Example 5

Ta and Cu targets having a purity of 99.99% (both having a diameter of 152.4 mm, manufactured by Kojundo Chemical Laboratory Co., Ltd.) were used, to form a film on a quartz substrate in an argon atmosphere of 10 mTorr by using a DC sputtering system (SBH-2206, manufactured by ULVAC, Inc.). Film formation was performed by applying a metal mask on the quartz substrate, so that a 10 mm square film was formed on the substrate, and a pattern having a lead portion with a width of 1 mm was formed above the 10 mm square film.

At first, only Ta was film-formed to a thickness of 400 nm, and thereafter, a film having a Ta—Cu composition in which Ta was 43% by volume was formed to a thickness of 200 nm by cosputtering of Ta and Cu. This film was subjected to heat treatment in a vacuum at temperatures of 600° C. and 800° C. for one hour, and soaked in 6.7 mol/L of nitric acid for one hour, so that Cu was removed by elution.

After the film was washed in water and dried, the film was subjected to anodic oxidation in a phosphoric acid aqueous solution of 80° C. at a voltage of 10V for 10 hours, to thereby form a dielectric layer. The capacitance was calculated by performing measurement of the capacitance in the same manner as in example 1. The results are shown in Table 3.

Example 6

The same operation was performed as in example 5, except that the film thickness was 650 nm, and the heat treatment temperature was 600° C., 800° C., and 1000° C., in a film having a Ta—Cu composition in which Ta was 43% by volume. The results are shown in Table 3.

Example 7

The same operation was performed as in example 5, except that the Ta—Cu composition was Ta-65% by volume, the film thickness was 650 nm, and the heat treatment temperature and heat treatment atmosphere were 600° C. (in a vacuum), 800° C. (in a vacuum), 1000° C. (in a vacuum), and 1050° C. (in an argon atmosphere). The results are shown in Table 3.

Comparative Example 2

Only Ta was formed to a thickness of 400 nm on a quartz substrate under the same film forming conditions as in example 1, and the film was subjected to anodic oxidation under the same conditions as in example 1, to thereby measure the capacitance. The results are shown in Table 3.

Comparative Example 3

The same operation was performed as in example 5, except that the Ta—Cu composition was Ta-65% by volume, the film thickness was 650 nm, and the heat treatment temperature was 1050° C., and the heat treatment atmosphere was in a vacuum. The results are shown in Table 3.

Comparative Example 4

The same operation was performed as in example 5, except that the Ta—Cu composition was Ta-65% by volume, the film thickness was 650 nm, the heat treatment temperature was 1100° C., and the heat treatment atmosphere was in an argon atmosphere. The results are shown in Table 3.

TABLE 3

| | Anode No. | Hetero-phase component Compt. | Hetero-phase component Cont ratio (vol %) | Film thickness of porous portion (nm) | Heat treatment temperature (° C.) |
|---|---|---|---|---|---|
| Com-Ex. 2 | 4 | — | — | 0 | — |
| Ex. 3 | 5 | Mg | 60 | 300 | 400 |
| Ex. 4 | 6 | Mg | 60 | 300 | * |
| Ex. 5 | 7 | Cu | 43 | 200 | 600 |
| | 8 | Cu | 43 | 200 | 800 |
| Ex. 6 | 9 | Cu | 43 | 650 | 600 |
| | 10 | Cu | 43 | 650 | 800 |
| | 11 | Cu | 43 | 650 | 1000 |
| Ex. 7 | 12 | Cu | 65 | 650 | 600 |
| | 13 | Cu | 65 | 650 | 800 |
| | 14 | Cu | 65 | 650 | 1000 |
| | 15 | Cu | 65 | 650 | 1050 |
| Com-Ex. 3 | 16 | Cu | 65 | 650 | 1050 |
| Com-Ex. 4 | 17 | Cu | 65 | 650 | 1100 |

| | Heat treatment atmosphere | Anodic oxidation voltage (V) | Capacitance (μF) | Capacitance density (μFV/cm$^2$) |
|---|---|---|---|---|
| Com-Ex. 2 | — | 10 | 0.96 | 9.6 |
| Ex. 3 | Ar | 10 | 4.00 | 40.0 |
| Ex. 4 | * | 10 | 4.11 | 41.1 |
| Ex. 5 | Vacuum | 10 | 3.20 | 32.0 |
| | Vacuum | 10 | 2.66 | 26.6 |
| Ex. 6 | Vacuum | 10 | 7.86 | 78.6 |
| | Vacuum | 10 | 7.09 | 70.9 |
| | Vacuum | 10 | 4.58 | 45.8 |
| Ex. 7 | Vacuum | 10 | 8.85 | 88.5 |
| | Vacuum | 10 | 8.14 | 81.4 |
| | Vacuum | 10 | 5.48 | 54.8 |
| | Ar | 10 | 4.32 | 43.2 |
| Com-Ex. 3 | Vacuum | 10 | 1.52 | 15.2 |
| Com-Ex. 4 | Ar | 10 | 1.61 | 16.1 |

(* Substrate was heated to 300° C. and subjected to sputtering. Subsequent heat treatment was not performed.)
(Ex. = Example, Com-Ex. = Comparative Example)

As seen from Table 3, whereas the capacitance density of anode No. 4 in comparative example 2 comprising a Ta dense smooth film is 9.6 μFV/cm$^2$, the capacitance density of respective samples (anode Nos. 5 to 15) in examples 3 to 7, in which the Ta target and the Mg target are used, or the Ta target and the Cu target are used to perform cosputtering, and thereafter, heat treatment was performed under the conditions within the range of the production method according to the present invention to form a porous film, are 26.6 to 88.5 μFV/cm$^2$. That is, respective samples (anode Nos. 5 to 15) in examples 3 to 7 have a capacitance density 2.8 to 9.2 times the capacitance density of anode No. 4 in comparative example 2.

As for the influence of the film thickness, it is seen that the capacitance increases with an increase in the film thickness, from comparison between example 5 and example 6 in which the film thickness is different from each other. That is, since the anode comprising the porous valve metal thin film of the present invention has a three-dimensional porous structure, the surface area increases as the film thickness increases.

As for the influence of the content of the hetero-phase component, it is seen that in the range of examples, as the content ratio (volume %) of Cu as the hetero-phase component increases, the capacitance density increases, from comparison between example 5 and example 6 in which the content ratio (volume %) of Cu as the hetero-phase component is different from each other. That is, in the range of examples, a porous film can be obtained in which as the content ratio (volume %) of Cu as the hetero-phase component increases, the surface area increases.

As for the influence of the heat treatment temperature after film formation by sputtering, as seen from examples 5 to 7, the capacitance density increases as the heat treatment temperature becomes low in the range of the heat treatment temperature of from 600° C. to 1000° C., and a porous body having a large surface area can be obtained.

On the other hand, in anode No. 17 in comparative example 4, in which the heat treatment temperature was set to 1100° C. and the heat treatment temperature was increased exceeding the melting point (1063° C.) of Cu, although the film thickness of the porous portion was 650 nm, the capacitance density was 16.1 μFV/cm$^2$, which was about 1.7 times the capacitance density in comparative example 2, and a sufficient effect could not be obtained. Therefore, it can be considered that the heat treatment temperature needs to be below the melting point of the hetero-phase component.

As for the influence of the heat treatment atmosphere, it is seen that when the heat treatment temperature after film formation by sputtering is 1050° C., a larger capacitance density can be obtained by performing the heat treatment in the argon atmosphere rather than performing the heat treatment in a vacuum, from comparison between anode No. 15 in example 7 in which the heat treatment atmosphere is in argon and anode No. 16 in comparative example 3 in which the heat treatment atmosphere is in a vacuum. That is, when the heat treatment temperature is 1050° C., the capacitance density of anode No. 16 in comparative example 3 in which the heat treatment is performed in a vacuum is 15.2 µFV/cm², which is about 1.6 times the capacitance density in comparative example 2, wherein a sufficient effect cannot be obtained. On the other hand, the capacitance density of anode No. 15 in example 7 in which the heat treatment is performed in the argon atmosphere at the same heat treatment temperature is 43.2 µFV/cm², which is 4.5 times the capacitance density in comparative example 2, wherein the sufficient effect can be obtained. The capacitance density of anode No. 14 in example 7 is about 5.7 times the capacitance density in comparative example 2, wherein the sufficient effect can be obtained even when the heat treatment is performed in a vacuum, if the heat treatment temperature is 1000° C. Therefore, when the hetero-phase component is Cu, and the heat treatment is performed at a temperature immediately below the melting point (1083° C.) of Cu, it can be considered that the sufficient effect cannot be obtained unless the heat treatment is performed in the argon atmosphere.

In example 4, the heat treatment was not performed after film formation, and the film in the formed state was soaked in 6.7 mol/L of hydrochloric acid for one hour, so that Mg as the hetero-phase component was removed by elution. In this case, the obtained capacitance density is 41.1 µFV/cm², which is about 4.3 times the capacitance density in comparative example 2, and the capacitance density is sufficiently increased. Therefore, by heating the substrate at the time of sputtering for forming a thin film, an anode having a large capacitance density can be obtained without performing the heat treatment after film formation.

Example 8

A solid electrolyte was filled in micropores of anode Nos. 7, 9, 12, and 14 among the porous thin-film anode bodies in examples 5 to 7. Specifically, a procedure in which the anode was soaked in a manganese nitrate aqueous solution having a specific gravity of 1.2, and then subjected to heat treatment in air at a temperature of 300° C. for one hour was repeated ten times with respect to the porous thin-film anode bodies 7, 9, 12, and 14, to thereby fill the solid electrolyte into the micropores. By the heat treatment (at a temperature of 300° C. for one hour) of the porous thin-film anode bodies after being soaked in the manganese nitrate aqueous solution, the impregnated manganese nitrate was turned into manganese dioxide due to thermal decomposition.

Thereafter, an Ag electrode was film-formed on an upper face of the porous film to a thickness of 100 nm by sputtering, and measurement of the capacitance after filling of the solid electrolyte was performed. The measurement results for anode Nos. 7, 9, 12, and 14 are shown in Table 4.

TABLE 4

| Anode No. | Hetero-phase component | | Film thickness of porous portion (nm) | Heat treatment temp. (° C.) |
|---|---|---|---|---|
| | Compt. | Content ratio (vol %) | | |
| 7 | Cu | 43 | 200 | 600 |
| 9 | Cu | 43 | 650 | 600 |
| 12 | Cu | 65 | 650 | 600 |
| 14 | Cu | 65 | 650 | 1000 |

TABLE 4-continued

| Anodic oxid. voltage (V) | Wet Capacitance *1) (µF) | Capacitance after filling of solid electrolyte (µF) | Capacity occurrence ratio *2) (%) |
|---|---|---|---|
| 10 | 3.20 | 2.98 | 93.1 |
| 10 | 7.86 | 7.25 | 92.2 |
| 10 | 8.85 | 8.14 | 92.0 |
| 10 | 5.48 | 5.07 | 92.6 |

*1) Wet capacitance stands for capacitance after filling a liquid electrolyte, that is, capacitance in Table 3 (examples 5 to 7).
*2) Capacity appearance ratio = (capacitance after filling solid electrolyte/wet capacitance) × 100 (%)

Anode Nos. 7, 9, 12, and 14 in example 8 in which the solid electrolyte was filled have a capacity appearance ratio of 90% or higher, and excellent impregnating ability of the solid electrolyte. The characteristics of the capacitor such as equivalent series resistance (ESR) depend on whether the impregnating ability of the solid electrolyte is good or bad. Therefore, it can be expected that a capacitor having excellent characteristics can be obtained by using the anode according to the present invention.

As described above, the thin film capacitor produced by using the porous valve metal thin film of the present invention has a large capacitance and is thus useful as a capacitor.

The invention claimed is:

1. A porous valve metal thin film having an integral continuous structure, an outside surface and a plurality of micropores that are uniformly distributed within the integral continuous structure and connected to the outside surface, the integral continuous structure consisting of particles of a valve metal chosen from the group consisting of niobium, tantalum, niobium alloys, and tantalum alloys, wherein the outside surface of the thin film has a surface area that is at least double a surface area of the outside surface if the outside surface of the thin film were flat, each of the particles of the valve metal has a particle diameter within a range of 10 nm to 1 µm, and each of the micropores has a pore diameter within a range of 10 nm to 1 µm.

2. A porous valve metal thin film according to claim 1, wherein each of the particles of the valve metal has a particle diameter within a range of 10 nm to 0.2 µm.

3. A porous valve metal thin film according to claim 1, wherein the porous valve metal thin film has a capacitance density within a range of 26.6 to 152.1 µFV/cm².

4. A capacitor anode material comprising a metal foil and the porous valve metal thin film according to claim 1, the porous valve metal thin film being formed on one side or opposite sides of the metal foil.

5. A capacitor anode material according to claim 4, wherein the metal foil comprises niobium, tantalum, a niobium alloy or a tantalum alloy.

6. A capacitor anode material according to claim 4, wherein the metal foil comprises Cu.

7. A capacitor thin film anode comprising a porous valve metal thin film made of a capacitor anode material according to claim 4, and an oxide film of the valve metal formed on a surface of the porous valve metal thin film.

8. A capacitor anode material comprising an insulating substrate, a valve metal smooth film formed on the insulating substrate, and the porous valve metal thin film according to claim 1, formed on the valve metal smooth film.

9. A capacitor anode material according to claim 8, wherein the insulating substrate is made of any one of alumina, quartz, and surface thermally-oxidized silicon.

10. A capacitor anode material according to claim 8, wherein the insulating substrate is made of any one of a polyimide resin substrate, a polysulphone resin substrate, a polyether imide resin substrate, and a polyether ketone resin substrate.

11. A capacitor thin film anode comprising a porous valve metal thin film according to claim 1, and an oxide film of the valve metal formed on a surface of the porous valve metal thin film.

12. A thin film capacitor comprising a capacitor thin film anode according to claim 11 as a capacitor anode.

13. A thin film capacitor comprising a capacitor thin film anode according to claim 11, an electrically conductive layer formed on a surface oxide film of the capacitor anode, and a cathode formed on the electrically conductive layer.

14. A thin film capacitor according to claim 13, wherein the electrically conductive layer comprises a solid electrolyte.

15. A thin film capacitor according to claim 14, wherein the solid electrolyte is manganese dioxide or an electroconductive polymer.

* * * * *